United States Patent [19]

Isohata et al.

[11] Patent Number: 4,748,477
[45] Date of Patent: May 31, 1988

[54] EXPOSURE APPARATUS

[75] Inventors: Junji Isohata, Tokyo; Koichi Matsushita, Chiba; Hironori Yamamoto, Chigasaki; Makoto Miyazaki, Yokohama; Kunitaka Ozawa, Isehara; Hideki Yoshinari, Yokohama, all of Japan

[73] Assignee: Canon Kabushiki Kaisha, Tokyo, Japan

[21] Appl. No.: 856,222

[22] Filed: Apr. 28, 1986

[30] Foreign Application Priority Data

Apr. 30, 1985 [JP] Japan .................................. 60-090898
Apr. 30, 1985 [JP] Japan .................................. 60-090899

[51] Int. Cl.$^4$ ....................... G03B 27/42; G03B 27/53
[52] U.S. Cl. ......................................... 355/53; 356/400
[58] Field of Search ............... 250/440.1, 441.1, 442.1, 250/491.1, 492.1, 492.2, 492.24; 355/53, 43, 54, 77; 356/399, 400

[56] References Cited

U.S. PATENT DOCUMENTS 4,370,054  1/1983  Isohata et al. ......................... 355/53
4,496,239  1/1985  Isohata et al. .................... 355/77 X

*Primary Examiner*—L. T. Hix
*Assistant Examiner*—D. Rutledge
*Attorney, Agent, or Firm*—Fitzpatrick, Cella, Harper & Scinto

[57] ABSTRACT

An exposure apparatus for exposing in a step-and-scan manner a plate-like member to a pattern with radiation so that images of the pattern are transferred onto different regions on the plate-like member. The exposure apparatus includes a mirror imaging optical system for projecting the image of the pattern onto the plate-like member. Also, the exposure apparatus includes a carriage for scanningly moving, at the time of exposure, the plate-like member relative to the mirror imaging optical system and a stage for step-feeding the plate-like member at the time of non-exposure so as to sequentially place the different regions of the plate-like member at an exposure station under the mirror imaging system. The stage is mounted on the carriage, and the movement of the carriage is guided by linear air-bearings. The apparatus is arranged such that inclination of the carriage relative to the mirror imaging system to be caused by the movement of the stage is corrected by controlling the amount of air supply to the linear air-bearings, whereby occurrence of shift between the images to be transferred onto the plate-like member is prevented regardless of the change in position of the stage relative to the carriage. In another aspect, the amount of movement of the stage is corrected in accordance the amount of image shift which otherwise may be caused, whereby occurrence of such image shift is prevented.

12 Claims, 4 Drawing Sheets

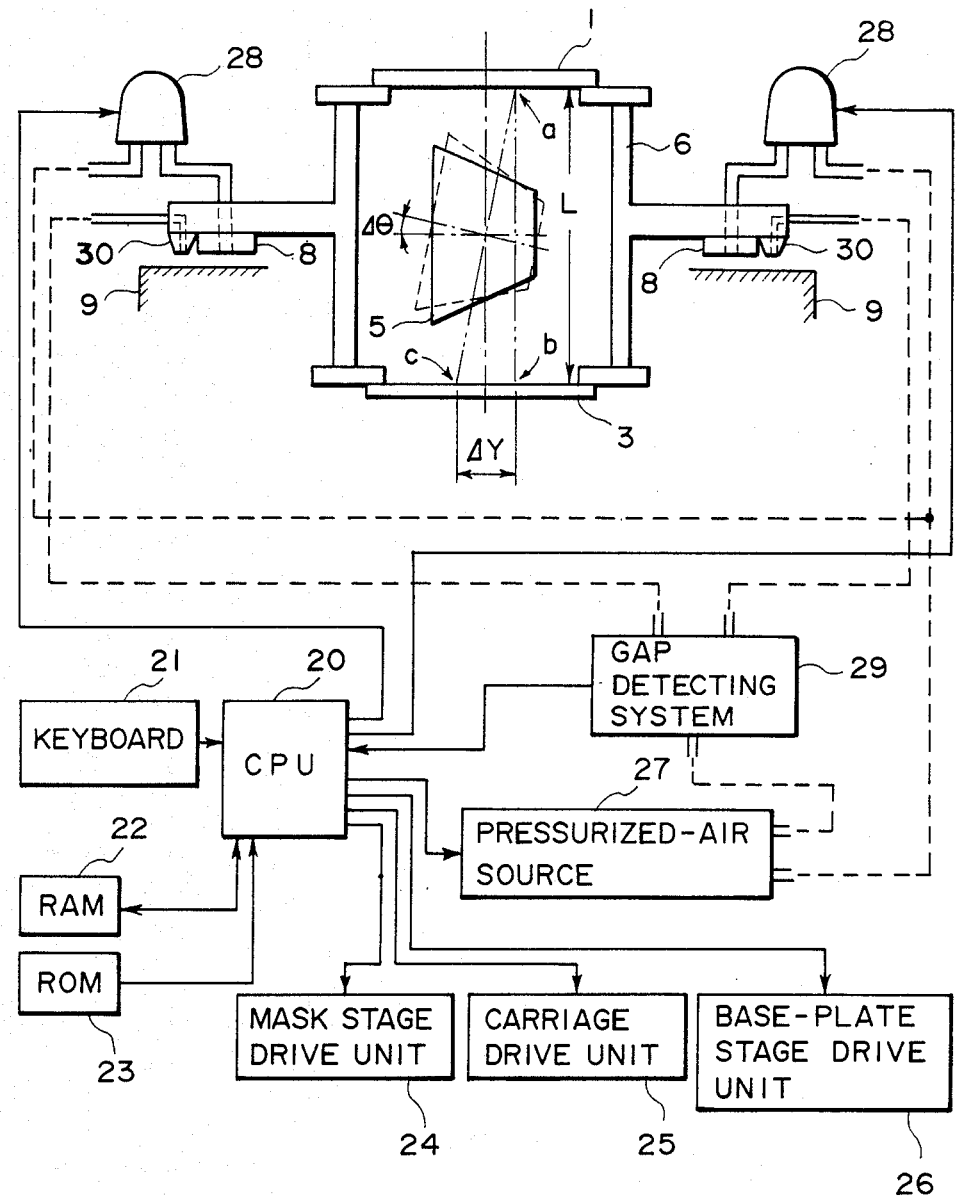
F I G. 4

EXPOSURE APPARATUS

FIELD OF THE INVENTION AND RELATED ART

This invention relate to an exposure apparatus for exposing a plate-like member to a pattern with radiation in a step-and-repeat manner so as to transfer images of the pattern onto different regions on a surface of the plate-like member, respectively. More particularly, the invention is concerned with an exposure apparatus such as mentioned above which is arranged to effect scanning exposure.

Exposure apparatuses are known, e.g., in the field of manufacture of semiconductor devices such as integrated circuits, as means for photolithographically transferring a fine pattern of a mask or reticle onto a substrate or semiconductive wafer. And, various types of exposure apparatuses, such as contact type, proximity type, mirror projection type, lens projection type, etc., have been developed.

Of these exposure apparatuses, the mirror projection type exposure apparatus is arranged such that a mask having a fine pattern formed thereon and a plate-like member (semiconductor wafer) onto which the pattern is to be transferred are carried by a carriage in a predetermined positional relation and the carriage is scanningly moved during exposure, whereby the image of the pattern as a whole is "printed" on the plate-like member. In this type of exposure apparatus in order to enlarge the size of the mask in accordance with an enlargement in the size of the plate-like member, to reduce the manufacturing cost per one chip (semiconductor chip), or to use the apparatus to manufacture large-size flat-panel liquid crystal display devices (for use in TV display devices or the like), it is necessary to enlarge or expand the field of exposure defined at a moment during the scanning exposure and also to increase the amount of scanning movement. This results in a disadvantageous enlargement of the size of the exposure apparatus.

This problem can be avoided if the transfer of a pattern of large size to the plate-like member is effected by a plurality of exposures. That is, the surface of the plate-like member is divided into different regions and the scanning exposure is repeatedly effected relative to the different regions of the plate-like member in sequence so that a substantially integral pattern is transferred onto the plate-like member. This is called in this Specification as "step-and-scan exposure". To achieve this, an X-Y stage of the same type as that used in steppers (step-and-repeat type lens-projection exposure apparatuses) or the like may be mounted on the carriage carrying the mask and the plate-like member.

If, however, such an X-Y stage is carried by the carriage and images of the pattern are transferred onto a plate-like member in the step-and-scan exposure manner, there is a possibility of the occurrence of a positional deviation between the images transferred onto the plate-like member. One example of this will be described as follows:

Usually the X-Y stage has a relatively heavy weight of an order of 40 kg. On the other hand, the carriage is usually floatingly supported by means of linear air-bearings in order to assure smooth scanning movement at the time of the exposure operation. So, when the X-Y stage carried by the carriage is moved relative to the carriage, the center of gravity of the carriage is displaced, with the result that the posture of the carriage is changed. A change in posture of the carriage leads to a deviation in the field of exposure.

SUMMARY OF THE INVENTION

It is accordingly a primary object of the present invention to provide an exposure apparatus of the step-and-scan type, by which patterns are accurately transferred onto different regions of a plate-like member.

Briefly, according to the present invention, there is provided an apparatus for exposing a plate-like member to a pattern with radiation so that images of the pattern are transferred onto different regions on the plate-like member, the apparatus comprising: a carriage; a stage for supporting the plate-like member and guidingly moving the plate-like member relative to the carriage; means for supporting the carriage; means for exposing the plate-like member to the pattern with radiation so that the image of the pattern is transferred onto the plate-like member, the exposing means exposing the plate-like member while moving the carriage with an aid of the supporting means; and means for correcting deviation of a position of transfer of the image of the pattern onto the plate-like member due to a change in posture of the carriage to be caused by the movement of the stage relative to the carriage.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic and diagrammatic view of an exposure apparatus according to another embodiment of the present invention.

DESCRIPTION OF THE PREFERRED EMBODIMENTS

Figure 1:
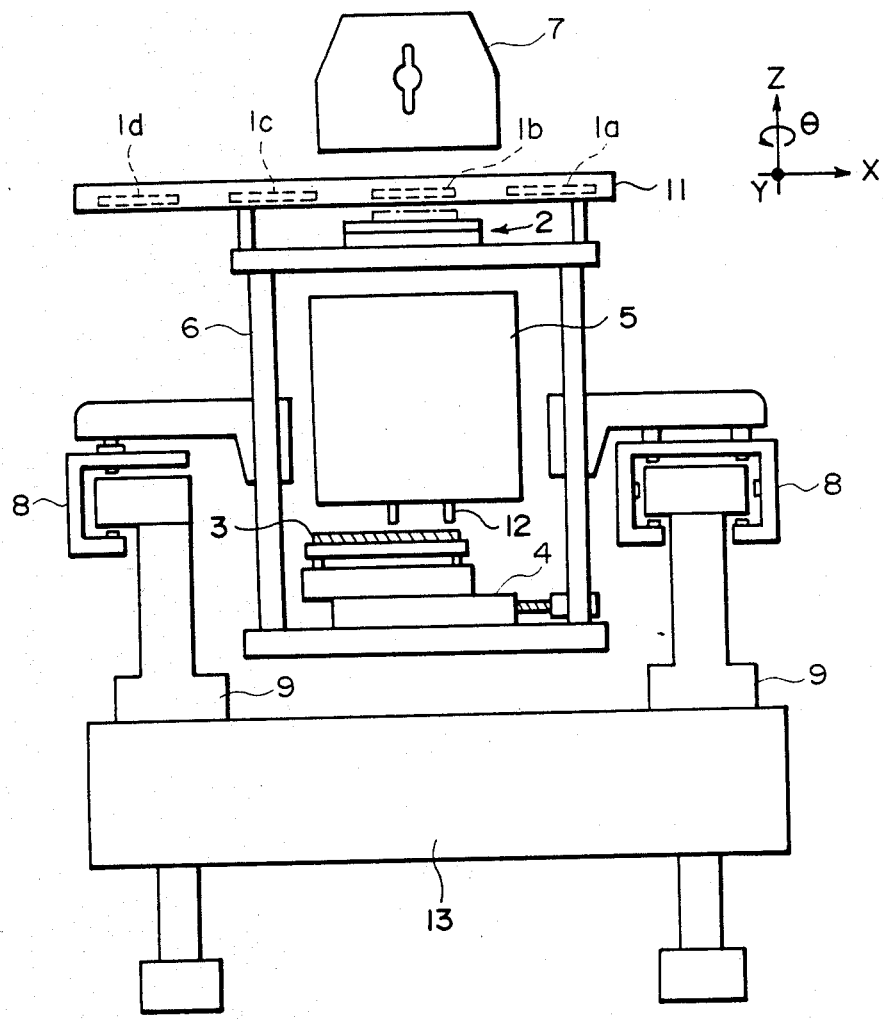
FIG. 1 is a schematic view of an exposure apparatus to which an embodiment of the present invention pertains.

Referring first to FIG. 1, there is shown an exposure apparatus which is usuable in the manufacture of large-size flat-panel display devices and to which the present invention pertains. As shown in FIG. 1, the exposure apparatus is usable with four photomasks 1 (1a, 1b, 1c and 1d) each having a fine pattern formed on its lower surface. The exposure apparatus includes a mask stage 2 for carrying thereon one of the masks 1a-1d at a time. The mask stage 2 is movable in each of X, Y and θ (rotational) directions for fine adjustment of the position of the mask carried by the mask stage. Denoted in this FIG. by numeral 3 is a glass substrate or base plate of rectangular shape having a diagonal length of the order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes.

The glass base plate 3 is held by a base-plate carrying stage 4 which is movable in each of the X, Y and θ (rotational) directions. Also, the stage 4 is arranged to be moved stepwise in each of the X and Y directions, for the sake of plural-shot exposure (four-shot exposure in this case) of the glass base plate 3 as will be described later. Such step-feeding of the stage 4 is controlled by a fine movement-measuring system using a laser interferometer, not shown. The exposure apparatus further includes a mirror projection optical system 5 of known type, comprising a combination of trapezoidal, concave and convex mirrors. The mirror projection system is adapted to project, onto the glass base plate 3 at a unit magnification, an image of the pattern of one of the masks 1a–1d which is held at a predetermined position (exposure station) by the mask stage 2. A carriage 6 is provided to hold the mask stage 2 and the base-plate stage 4 in a predetermined relation.

An illumination optical system 7 includes a light source (not shown) for providing a light of a predetermined wavelength or wavelength range to illuminate one of the masks held at the predetermined exposure station by the mask stage 2. By exposing a photosensitive layer formed on the glass base plate 3 to light passed through the pattern of the mask held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 8 and 8 are linear air-bearing assemblies (hereinafter simply "LAB") which are movable along two guide rails 9 and 9, respectively, extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. The carriage 6 is supported by the LAB 8. With this arrangement, the mask 1 carried by the mask stage 2 and the glass base plate 3 carried by the base-plate stage 4 can be scanningly moved as a unit in the Y direction relative to the projection system 5, during the exposure of the mask and the base plate to the light emitted from the illumination optical system 6. One complete movement of the carriage 6 is effective to achieve one scanning exposure relative to one-fourth (¼) of the base plate 3 with corresponding mask 1a, 1b, 1c or 1d.

The exposure apparatus further includes a mask feeder 11 carrying the masks 1a–1d and for sequentially feeding the masks 1a–1d to the exposure station on the mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5. For example, air-microsensors utilizing air pressure or photoelectric sensors utilizing reflection light from the base plate 3 are usable as the gap sensors. The projection optical system 5, the illumination optical system 7 and the guide rails 9 are supported by a base or surface plate 13 in a predetermined interrelation.

FIGS. 2A–2E show the manner of pattern transfer according to the step-and-scan type exposure process adopted in the apparatus of FIG. 1. Denoted in FIGS. 2A–2E by numerals 1a–1d are the photomasks; by 3, the base plate; and by 4, the stage for the base plate 3. All of these elements are those shown in FIG. 1. Also denoted in FIGS. 2A–2E by numerals 1a′–1d′ are effective pattern-transferring regions onto which patterns contributable to form a liquid crystal display device, for example, are to be transferred. Also denoted in these Figures by numeral 7a is the range of illumination which is defined by the projection optical system 5 and in which the light from the illumination optical system 7 is incident for the purpose of pattern transfer. Arrows in FIGS. 2A–2E show the directions of scanning movement of the base plate 3 (or the carriage 6) at the time of pattern transfer.

Figure 2A:
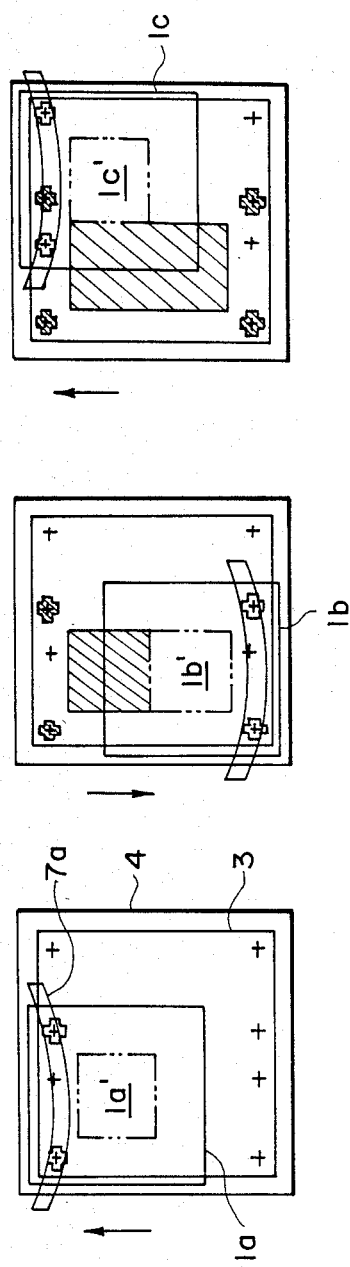
FIGS. 2A-2E are explicatory views schematically showing the exposure operation of the apparatus shown in FIG. 1.

The pattern transfer operation is effected in the following manner:

First, for the purpose of alignment of the base plate 3 with respect to the mask 1a held on the mask stage 2, the stage 4 is moved so as to bring the base plate 3 to the position of FIG. 2A. Subsequently, the carriage 6 carrying the mask stage 2 and the base-plate stage 4 are moved in a predetermined scanning direction. By this means, an upper and left-hand quarter of the surface of the base plate 3 is scanningly exposed to the light passed through the mask 1a, whereby, the pattern of the mask 1a is transferred onto the region 1a′.

Figure 2B:
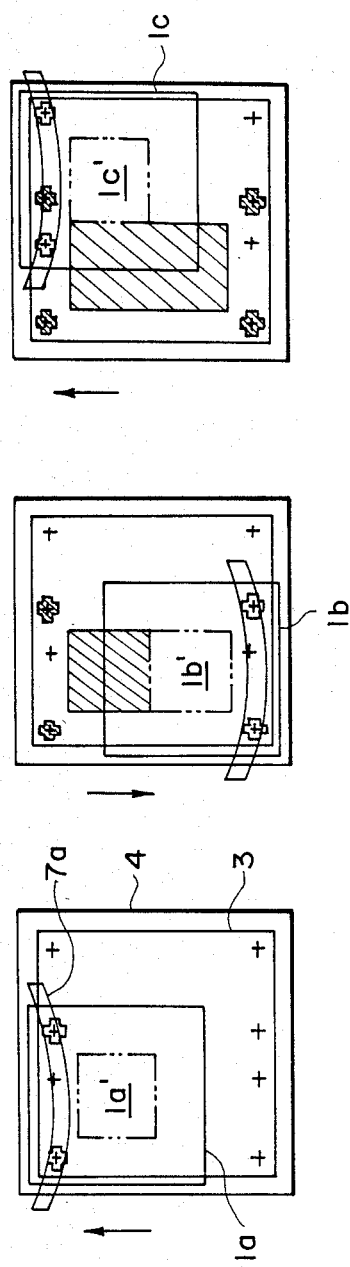

Then, the mask 1a held on the mask stage 2 is replaced by the mask 1b and, at the same time, the base-plate stage 4 is moved so as to bring the base plate 3 into a positional relation with the mask 1b, such as shown in FIG. 2B. Thereafter, the carriage 6 is scanningly moved in the direction opposite to the direction of scan having been made with reference to the mask 1a. By this, a lower and left-hand quarter of the surface of the base plate 3 is exposed to the light passed through the mask 1b, whereby, the pattern of the mask 1b is transferred onto the region 1b′.

Figure 2C:
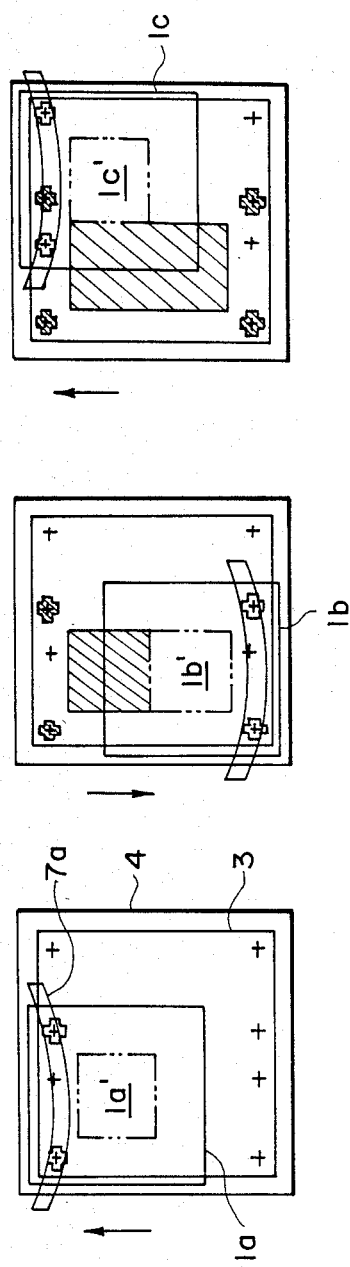
Figure 2D:
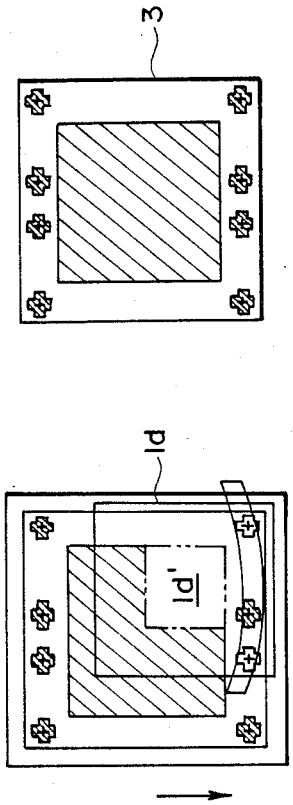
Figure 2E:
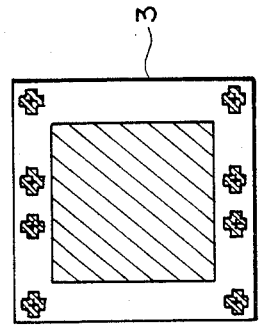

In similar manners, the pattern of the mask 1c is transferred onto the region 1c′ in an upper and right-hand quarter of the base plate 3 such as shown in FIG. 2C, while the pattern of the mask 1d is transferred onto the region 1d′ in a lower and right-hand quarter of the base plate 3 such as shown in FIG. 2E. By this method, a substantially integral pattern of large size is transferred onto the base plate 3.

Figure 3:
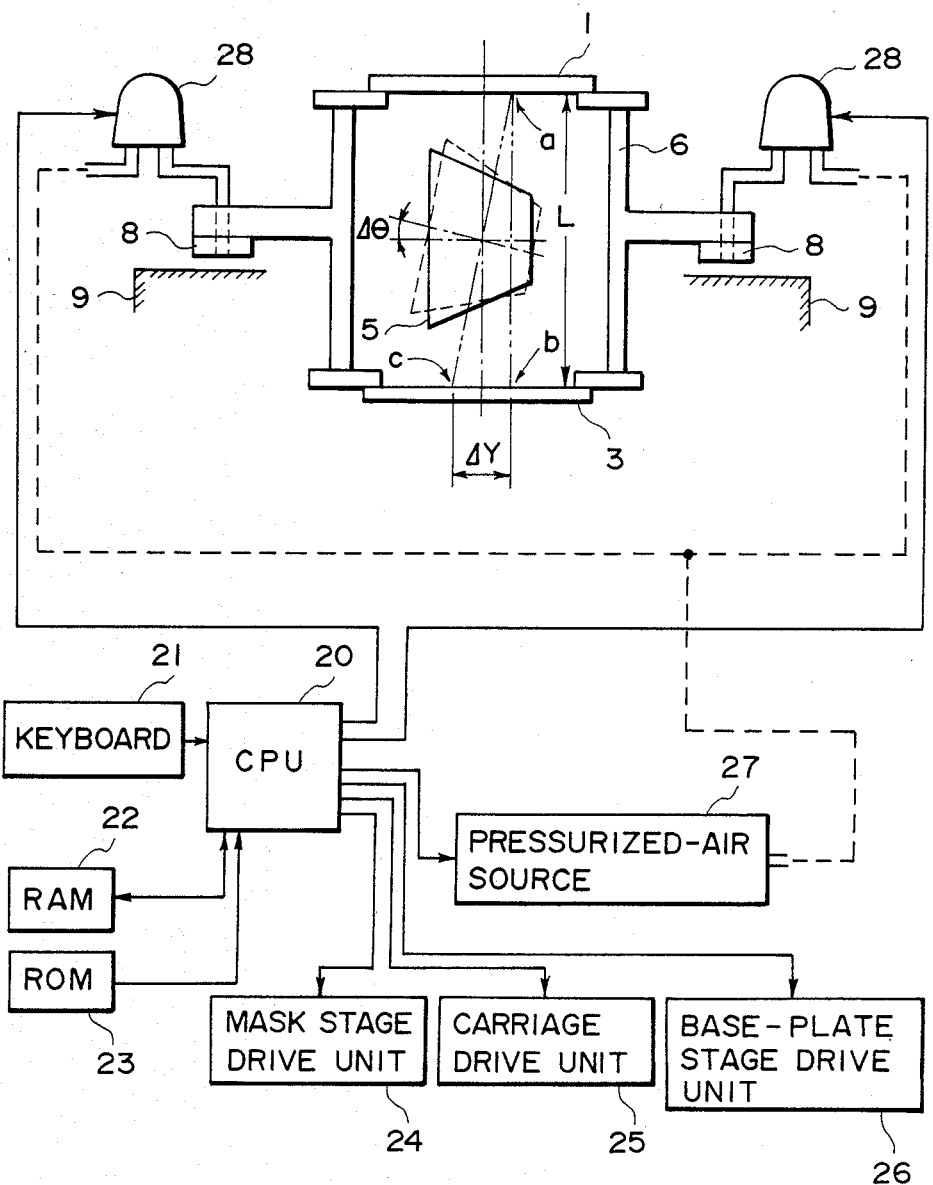
FIG. 3 is a schematic and diagrammatic view of an exposure apparatus according to an embodiment of the present invention.

FIG. 3 is a schematic and diagrammatic view for explicating a distinctive feature of an embodiment of the present invention. In FIG. 3, elements having similar or corresponding functions as those shown in FIGS. 1 and 2A–2E are denoted by the same reference numerals. Also, in FIG. 3, all of the mask 1, base plate 3 and projection optical system 5 are depicted as they are viewed in the X direction (FIG. 1), whereas the remaining elements are depicted as they are viewed in the Y direction (FIG. 1). Further, in FIG. 3, illustration of the mask stage 2 and the base-plate stage 4 is omitted and, in addition, only a trapezoidal mirror is illustrated as a representative of the projection optical system 5. This is only for the sake of simplicity in illustration.

As diagrammatically shown in FIG. 3, the exposure apparatus of the present embodiment is provided with a control system which includes a controller or central processing unit 20 (hereinafter "CPU") for controlling various operations of the exposure apparatus as a whole in accordance with various data supplied from a read-only-memory (ROM) 23. A keyboard 21 is provided to input variable data into a random access memory (RAM) 22 by way of the CPU 20, as will be described later. Further, the exposure apparatus is provided with a driving unit 24 for driving the mask stage 2 such as shown in FIG. 1, another driving unit 25 for driving the carriage 6, a further driving unit 26 for driving the base-plate stage 4 such as shown in FIG. 1, a pressurized-air source 27 for producing a pressurized-air which is to be supplied to the LAB 8—8, servo valves 28—28 arranged to adjust or regulate the discharge of air from the LAB 8—8 in accordance with instruction signals supplied thereto from the CPU 20.

If, in such exposure apparatus, displacement of the center of gravity of the carriage 6 due to the movement of the stage 4 carried by the carriage 6 causes inclination of the carriage 6 by an angle $\Delta\theta$, the positional relation between the carriage 6 and the projection optical system 5 is changed as is depicted by a broken-line position of the projection system 5. Actually, the projection optical system 5 is stationary and the carriage 6 is inclined. However, for ease of understanding, the posture of the projection optical system 5 is changed in FIG. 3 so as to depict the relative inclination of the projection system 5 and the carriage 6. If the posture of the carriage 6 is maintained constant, the positional relation between the carriage 6 and the projection optical system 5 is depicted by the solid-line position of the projection system 5. Therefore, without any change in the posture of the carriage 6, an image of a point a on the mask 1 is formed by projection on a point b on the base plate 3. If, however, the posture of the carriage 6 is changed by an angle $\Delta\theta$, the image of a point a of the mask 1 is projected on a point c of the base plate 3. That is, the change in posture of the carriage 6 causes a shift of the image, being projected, by an amount $\Delta Y$ ($=L\cdot\Delta\theta$) where L is the distance between the mask 1 and the base plate 3. The change in posture of the carriage 6 is possible in each of the X and Y directions. Particularly, the amount of change is large in the direction of the Y axis. As a result, a large amount of image-shift appears in the direction of the Y axis.

Such a problem is avoided by the exposure apparatus of the present embodiment shown in FIGS. 1 and 3. That is, if there occurs any change in posture of the carriage 6, shifting of image described above due to a change in posture of the carriage 6 is prevented by correcting the movement of the stage 4 by placing each of the different shot areas of the base plate 3 at the exposure station under the projection optical system 6. More specifically, upon movement of the stage 4, the amount of movement thereof (in the X and Y directions) is corrected by an amount corresponding to the amount of shift of image due to the change in posture of the carriage 6. By this method, occurrence of the image shift is prevented whereby, the patterns of the masks 1a–1d are accurately transferred onto the regions 1a'–1d' (FIGS. 2A–2D) in a substantially contiguous relation such as suggested in FIG. 2E.

The correction of the movement of the stage 4 can be determined in the following manner:

The most significant factor for the change in posture of the carriage in connection with the pattern transfer operation is the movement of the stage 4 for sequentially placing the different shot areas of the base plate 3 at the exposure station. This is because the stage 4 has a relatively heavy weight so that movement of the stage 4 causes significant displacement of the center of gravity of the carriage 6. This means, on the other hand, that the relation between the position of the stage 4 and the amount of image shift due to the change in posture of the carriage 6 can be expressed in the form of a function.

For example, with respect to the Y direction in which the amount of image shift is large, the movement of the stage 4 in the X direction has little effect on the image shift in the Y direction. So, the amount of shift $\Delta Y$ of the image being projected can be expressed as follows:

$$\Delta Y = f_y(y)$$

wherein y is the position of the stage 4. Accordingly, each time the stage 4 is to be moved so as to place one of the different shot areas of the base plate 3 at the exposure station, the amount of movement of the stage 4 is corrected by an amount corresponding to the amount of image shift as can be calculated by the CPU 20 on the basis of the above-described function $\Delta Y = -f_Y(y)$. And, by the thus obtained amount (i.e. the amount of regular movement plus the amount of image shift), the stage 4 is moved.

The amount of such image shift is preparatorily measured or detected for each of the movements of the stage 4, conveying respective shot areas of the base plate 3 to the exposure station. Most conveniently, the amount of image shift in relation to each of the different shot areas of the base plate is detachable from the results of trial exposures using a few sheets of base plates. The thus detected data on the amount of image shift is inputted into the CPU 20 by means of the keyboard 21 or the like and is stored into the RAM 22 in the form of a table. For example, values $\Delta X1$ and $\Delta Y1$ are stored in the RAM 22 for the amount of image shift with respect to the movement of the stage 4 from a "first-shot-area exposing position" to a "second-shot-area exposing position", values $\Delta X2$ and $\Delta Y2$ are stored in the RAM 22 for the amount of image shift with respect to the movement of the stage 4 from the "second-shot-area exposing position" to a "third-shot-area exposing position", and so on. As for the data about the amount of image shift to be stored, values detected by preparatory measurement may be inputted into the apparatus from the keyboard. Alternatively, the function such as described in the foregoing may be stored such that the amount of image shift is detected by calculation when the detection is desired. Of course, the numerical data about the amount of image shift, detected from the results of trial exposures, may be directly stored. In any case, by scanningly moving the carriage 6 with the correction described in the foregoing, a pattern can be accurately transferred onto the base plate without any image shift.

Another embodiment of the present invention will now be described, taken in conjunction with FIG. 4. In this Figure, elements having similar or corresponding functions as of those shown in FIGS. 1–3 are denoted by the same reference numerals.

In this embodiment, the exposure apparatus is provided with a gap detecting system 29 comprising air-microsensors, for example. Denoted in this Figure by numerals 30 and 30 are nozzles of air-microsensors, disposed in the same plane as of the LAB 8—8. The gap detecting system 29 is arranged to detect or measure, at each sensor nozzle 30, the distance in the Z direction between the sensor nozzle 30 and corresponding one of the guide rails 9—9. The data detected by the measurement at the gap detecting system 29 is inputted into the CPU 20. Each of the sensor nozzles 30—30 is supplied with pressurized air from the pressurized-air source 27 by way of the gap detecting system 29. The remaining portion of the structure of the present embodiment is essentially the same as that of the FIG. 3 embodiment. In the exposure apparatus of the present embodiment shown in FIGS. 1 and 4, if there occurs any change in the posture of the carriage 6, the gap detecting system 29 is operative to detect gaps or distances between the LAB 8—8 and the guide rails 9—9, i.e. between the sensor nozzles 30—30 and the guide rails 9—9. The discharge of air from the LAB 8—8 can be controlled by the servo valves 28—28 under the influence of the CPU 20. So, in accordance with the gaps detected by the gap detecting system 29 with the aid of sensor nozzles 30—30, the CPU 20 is operated to control, with the aid of the servo valves 28—28 pressures of air to be discharged from the LAB 8—8 so that the distances as detected by the sensor nozzles 30—30 become equal to each other. By this means, the change in posture of the carriage 6, that is its inclination, is corrected. By scanningly move the carriage 6 after correction of inclination, patterns of the masks 1a–1d are accurately transferred onto the regions 1a'–1d' (FIGS. 2A–2D) without image shift, whereby, a substantially integral pattern of large size is "printed" on the base plate 3, such as shown in FIG. 2E.

In accordance with the present invention, as has hitherto been described, any shift or positional deviation of a pattern being transferred onto a plate-like member, due to any change in posture of a carriage caused by movement of a stage carrying the plate-like member, is corrected satisfactorily. As a result, patterns can be transferred onto the plate-like member with high accuracy and in a satisfactorily contiguous fashion. So, manufacture of large-size flat-panel display devices usable, e.g., as liquid crystal TV display devices is facilitated.

While the invention has been described with reference to the structures disclosed herein, it is not confined to the details set forth and this application is intended to cover such modifications or changes as many come within the purposes of the improvements or the scope of the following claims.

What is claimed is:

1. An apparatus for exposing a plate-like member to a pattern with radiation so that images of the pattern are transferred onto different regions on the plate-like member, said apparatus comprising:
   a carriage;
   a stage for supporting the plate-like member and guidingly moving the plate-like member relative to said carriage;
   means for supporting said carriage;
   means for exposing the plate-like member to the pattern with radiation so that the image of the pattern is transferred onto the plate-like member, said exposing means exposing the plate-like member while moving said carriage with the aid of said supporting means; and
   means for correcting a deviation in the position of the image of the pattern transferred onto the plate-like member due to a change in posture of said carriage caused by the movement of said stage relative to said carriage.

2. An apparatus according to claim 1, wherein said supporting means supports said carriage with an aid of a fluid.

3. An apparatus according to claim 2, wherein said supporting means includes a linear air-bearing.

4. An apparatus according to claim 1, wherein said correcting means corrects an amount of movement of said stage to be made in relation to each of exposures for the different regions of the plate-like member.

5. An apparatus according to claim 4, wherein said correcting means is arranged to preparatorily store information about the deviation of the position of transfer of the image of the pattern onto the plate-like member to be caused by the movement of said stage, and is arranged to correct the amount of movement of said stage on the basis of the information stored and a position assumed by said stage when the movement is stopped.

6. An apparatus according to claim 1, wherein said correcting means includes means for detecting a change in posture of said carriage and means for controlling the support of said carriage by said supporting means in accordance with an output from said detecting means.

7. An apparatus according to claim 6, wherein said controlling means controls said supporting means so as to maintain the posture of said carriage constant.

8. An apparatus according to claim 7, wherein said supporting means supports said carriage by way of a fluid.

9. An exposure apparatus, comprising:
   a radiation source for emitting radiation;
   a mask holder for holding a mask;
   a workpiece holder for holding a workpiece;
   a movable carriage for carrying thereon said mask holder and said workpiece holder;
   a guide rail for guiding the movement of said carriage;
   a fluid bearing operable to movably support said carriage upon said guide rail;
   carriage driving means operable to move said carriage along said guide rail so that one of different portions of the workpiece held by said workpiece holder is exposed to the radiation emitted from said radiation source and passed through the mask held by said mask holder;
   holder driving means operable, each time one of the different portions of the workpiece is exposed, to displace said workpiece holder relative to said carriage so that, by the cooperation with said carriage driving means, the different portions of the workpiece are exposed in a predetermined sequence; and
   control means operable to control the displacement of said workpiece holder by said holder driving means so as to substantially compensate for a change in the posture of said carriage relative to said guide rail when said workpiece holder is displaced relative to said carriage.

10. An apparatus according to claim 9, wherein said control means includes a memory adapted to store therein data relative to the change in the posture of said carriage relative to said guide rail when said workpiece holder is displaced relative to said carriage.

11. An exposure apparatus, comprising:
   a radiation source for emitting radiation;
   a mask holder for holding a mask;
   a workpiece holder for holding a workpiece;
   a movable carriage for carrying thereon said mask holder and said workpiece holder;
   a guide rail for guiding the movement of said carriage;
   a fluid bearing operable to movably support said carriage upon said guide rail;
   carriage driving means operable to move said carriage along said guide rail so that one of different portions of the workpiece held by said workpiece holder is exposed to the radiation from said radiation source and passed through the mask held by said mask holder;

holder driving means operable, each time one of the different portions of the workpiece is exposed, to displace said workpiece holder relative to said carriage so that, by the cooperation with said carriage driving means, the different portions of the workpiece are exposed in a predetermined sequence;

detecting means for detecting a change in the posture of said carriage relative to said guide rail when said workpiece holder is displaced relative to said carriage; and control means operable to control the fluid discharging pressure from said fluid bearing in accordance with the detection of said detecting means, so as to correct the change in the posture of said carriage relative to said guide rail.

12. An apparatus according to claim 11, wherein said detecting means includes a gap sensor for sensing a gap between said carriage and said guide rail.

* * * * *

UNITED STATES PATENT AND TRADEMARK OFFICE
CERTIFICATE OF CORRECTION

PATENT NO. : 4,748,477                  Page 1 of 2
DATED : May 31, 1988
INVENTOR(S) : JUNJI ISOHATA, ET AL.

It is certified that error appears in the above-identified patent and that said Letters Patent is hereby corrected as shown below:    Title page:

AT [57] IN THE ABSTRACT

Line 25, "dance the" should read --dance with the--.

COLUMN 1

Line 6, "relate" should read --relates--.
    Line 49, "as" should be deleted.

COLUMN 2

Line 20, "with an" should read --with the--.

COLUMN 4

Line 32, "this," should read --this means,--.

COLUMN 5

Line 29, "of the" should read --on the--.

COLUMN 6

Line 7, "$\Delta Y = f_y(y)$" should read --$\Delta Y = f_Y(y)$--.
    Line 24, "detachable" should read --detectable--.

COLUMN 7

Line 18, "move" should read --moving--.
    Line 37, "many" should read --may--.
    Line 43, "transfered" should read --transferred--.
    Line 63, "an aid" should read --the aid--.

UNITED STATES PATENT AND TRADEMARK OFFICE
CERTIFICATE OF CORRECTION

PATENT NO. : 4,748,477

DATED : May 31, 1988

INVENTOR(S) : JUNJI ISOHATA, ET AL.

It is certified that error appears in the above-identified patent and that said Letters Patent is hereby corrected as shown below:

<u>COLUMN 8</u>

Line 2, "of" should read --on--.

<u>COLUMN 10</u>

Line 7, "of" should read --by--.

Signed and Sealed this

Fifteenth Day of November, 1988

Attest:

DONALD J. QUIGG

*Attesting Officer*    *Commissioner of Patents and Trademarks*